(12) United States Patent
Niimura et al.

(10) Patent No.: US 12,745,418 B2
(45) Date of Patent: Sep. 22, 2026

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yasushi Niimura, Matsumoto-city (JP); Kazuya Yamaguchi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 329 days.

(21) Appl. No.: 18/495,467

(22) Filed: Oct. 26, 2023

(65) Prior Publication Data

US 2024/0186407 A1 Jun. 6, 2024

(30) Foreign Application Priority Data

Dec. 1, 2022 (JP) ................................ 2022-193101

(51) Int. Cl.
*H01L 29/78* (2006.01)
*H10D 30/01* (2025.01)
(Continued)

(52) U.S. Cl.
CPC ....... *H10D 30/665* (2025.01); *H10D 30/0297* (2025.01); *H10D 30/668* (2025.01); *H10D 62/393* (2025.01)

(58) Field of Classification Search
CPC .. H10D 30/665; H10D 30/668; H10D 62/393; H10D 30/0297
See application file for complete search history.

(56) References Cited

U.S. PATENT DOCUMENTS

2018/0269278 A1* 9/2018 Yamaguchi .......... H10D 62/115
2019/0148485 A1* 5/2019 Hamada ............... H10D 62/111
257/493

(Continued)

FOREIGN PATENT DOCUMENTS

JP 2018-152522 A 9/2018
WO 2017212773 A1 12/2017

OTHER PUBLICATIONS

Office Action issued for corresponding Japanese Patent Application No. 2022-193101, and its English translation, dated Jun. 30, 2026.

*Primary Examiner* — William C Trapanese
(74) *Attorney, Agent, or Firm* — Rabin & Berdo, P.C.

(57) ABSTRACT

A semiconductor device has a semiconductor substrate of a first conductivity type; a drift layer of the first conductivity type; a base layer of a second conductivity type; an active region through which a main current flows and having source regions of the first conductivity type, trenches, gate insulating films, and gate electrodes; and a termination region surrounding a periphery of the active region. The termination region has a conductive film electrically connected to the gate electrode, a field oxide film that insulates the conductive film from the drift layer, and a contact hole that penetrates through the conductive film and reaches the field oxide film. The contact hole is embedded in the field oxide film such that a thickness of the field oxide film below the contact hole has is 54 nm to 85 nm thinner than a thickness of the field oxide film outside the contact hole.

9 Claims, 16 Drawing Sheets

(51) Int. Cl.
*H10D 30/66* (2025.01)
*H10D 62/17* (2025.01)

(56) References Cited

U.S. PATENT DOCUMENTS

2023/0335628 A1* 10/2023 Kim .................... H10D 62/106
2024/0128329 A1* 4/2024 Hutzler ............. H10D 30/0297

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2022-193101, filed on Dec. 1, 2022, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, a semiconductor device that has a termination region surrounding a periphery of an active region, where the termination region has a gate contact that is in contact with a gate metal connected to gate electrodes and the termination region is connected to a base layer of a second conductivity type and further has a first semiconductor region of the second conductivity type extending to a bottom of the gate contact and a method of manufacturing the semiconductor device are commonly known (for example, refer to Japanese Laid-Open Patent Publication No. 2018-152522).

SUMMARY OF THE INVENTION

According to an embodiment of the invention, a semiconductor device, includes: a semiconductor substrate of a first conductivity type, the semiconductor substrate having a main surface; a drift layer of the first conductivity type, provided at the main surface of the semiconductor substrate; a base layer of a second conductivity type, provided at a surface layer of the drift layer; an active region through which a main current flows, the active region having a source region of the first conductivity type, selectively provided in a surface layer of the base layer, a trench reaching the drift layer from a surface of the source region, and a gate electrode provided in the trench via a gate insulating film; and a termination region surrounding a periphery of the active region, the termination region having a conductive film electrically connected to the gate electrode, a field oxide film that insulates the conductive film and the drift layer from each other, and a contact hole that penetrates through the conductive film and reaches the field oxide film. The contact hole is embedded in the field oxide film such that a thickness of the field oxide film below the contact hole is 54 nm to 85 nm thinner than a thickness of the field oxide film outside the contact hole.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a detailed cross-sectional view depicting a structure of a gate metal electrode of the semiconductor device according to the embodiment.

DETAILED DESCRIPTION OF THE INVENTION

Figure 1:
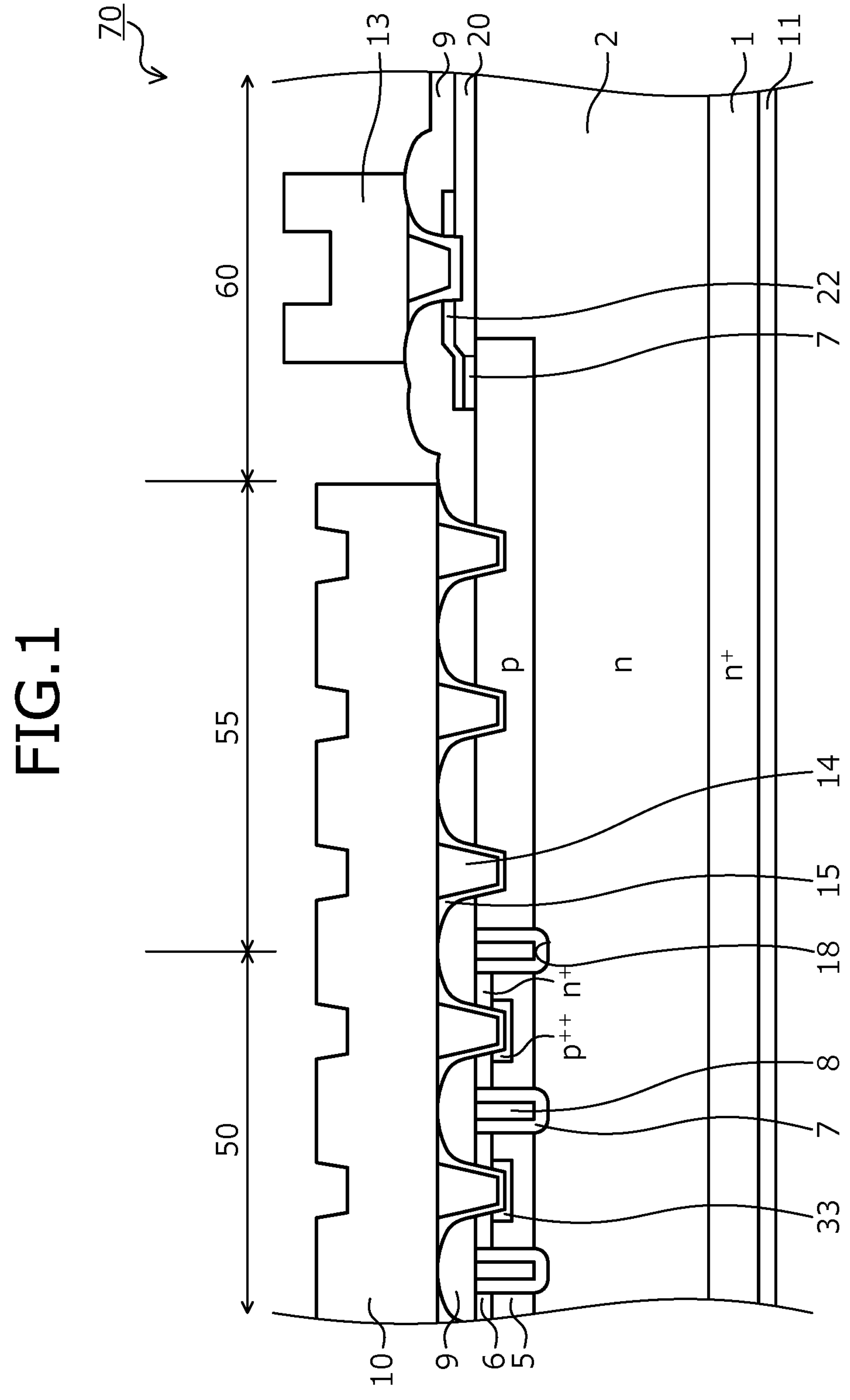
FIG. 1 is a cross-sectional view depicting a structure of a semiconductor device according to an embodiment.

First, problems associated with the conventional techniques are discussed. In the method of manufacturing the conventional semiconductor device, a problem arises in that at the gate contact, a field oxide film that insulates the gate metal and the first semiconductor region of the second conductivity type becomes thin.

Embodiments of a semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical are given the same reference numerals and are not repeatedly described. Further, with consideration of variation in manufacturing, description indicating the same or equal may be within 5%.

Figure 9:
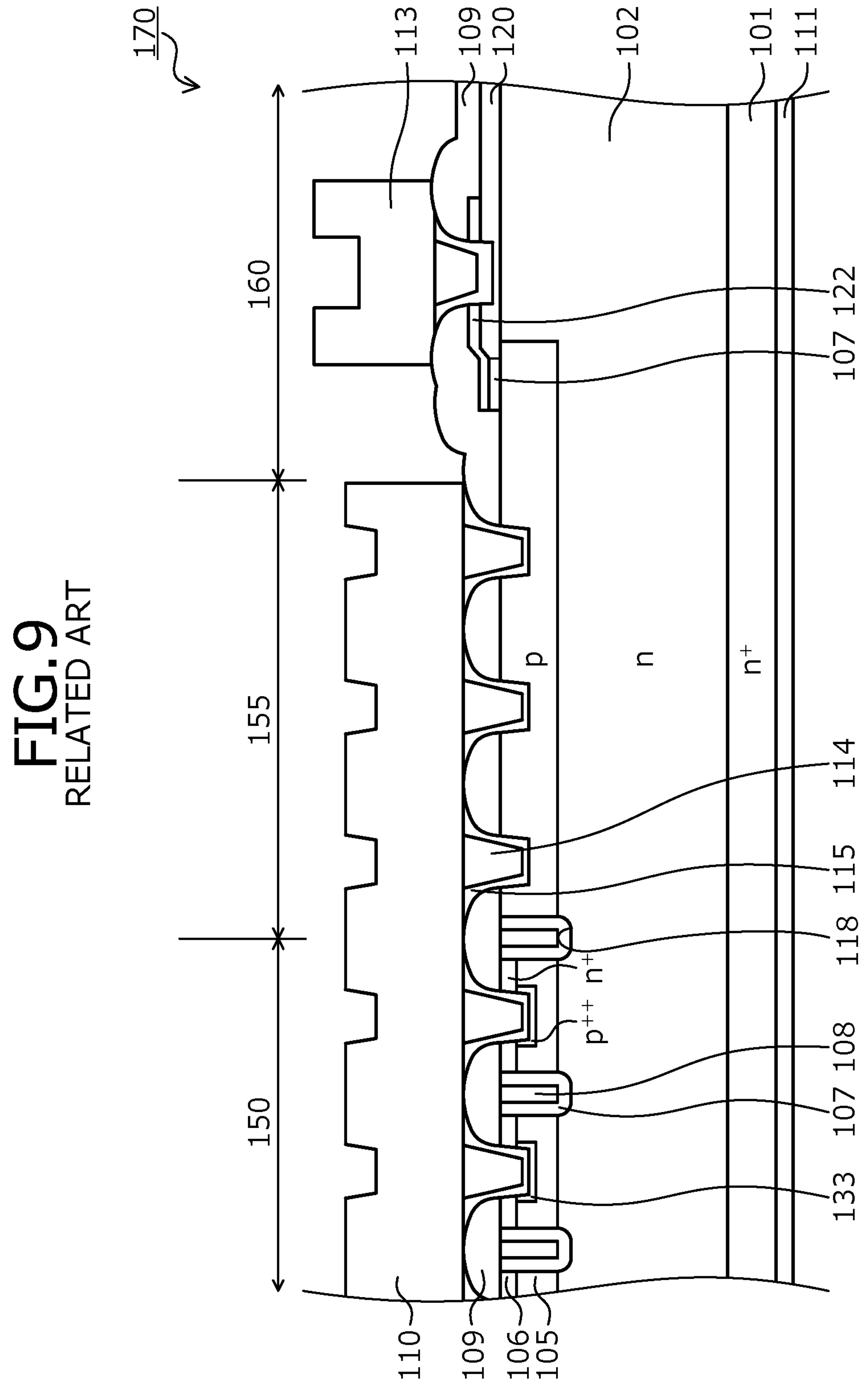
FIG. 9 is a cross-sectional view depicting a structure of a conventional semiconductor device.

First, the conventional semiconductor device is described. FIG. 9 is a cross-sectional view depicting a structure of the conventional semiconductor device. The structure of the conventional semiconductor device is described taking a trench-type MOSFET 170 as an example. The trench-type MOSFET 170 has an active region 150, an active region outer peripheral portion 155, and an edge termination region 160 that surrounds a periphery of the active region outer peripheral portion 155. The active region 150 and the active region outer peripheral portion 155 are regions through which current flows during an on-state. The edge termination region 160 includes a breakdown voltage sustaining region that mitigates electric field of a semiconductor-base front portion of a drain region and sustains a breakdown voltage.

In the trench-type MOSFET 170, an n-type drift layer 102 is deposited at a front surface of an $n^+$-type semiconductor substrate 101. In the active region 150, a MOS structure configured by a p-type base layer 105, $n^+$-type source regions 106, $p^{++}$-type contact regions 133, gate insulating films 107, gate electrodes 108, and gate trenches 118 is provided. The active region outer peripheral portion 155 is free of the MOS structure. Furthermore, in the trench-type MOSFET 170, an interlayer insulating film 109, a source electrode 110, and a back electrode 111 are provided. Contact plugs 114 and a barrier metal 115 are embedded in contact holes provided in the interlayer insulating film 109.

The p-type base layer 105 is provided on a surface of the n-type drift layer 102 in the active region 150 and the active region outer peripheral portion 155 while a field oxide film 120 is provided on the surface of the n-type drift layer 102 in the edge termination region 160. Further, in the edge termination region 160, a gate metal electrode 113 electrically connected to the gate electrodes 108 via a conductive film 122 is provided and the gate metal electrode 113 is insulated by the n-type drift layer 102 and the field oxide film 120.

Next, the method of manufacturing the conventional semiconductor device is described. FIGS. 10, 11, 12, 13, 14, and 15 are cross-sectional views depicting states of the conventional semiconductor device during manufacture. First, the $n^+$-type semiconductor substrate 101 containing silicon and constituting an $n^+$-type drain layer is prepared. Next, on a front surface of the $n^+$-type semiconductor substrate 101, the n-type drift layer 102, which has an impurity concentration that is lower than an impurity concentration of the $n^+$-type semiconductor substrate 101, is epitaxially grown.

Figure 10:
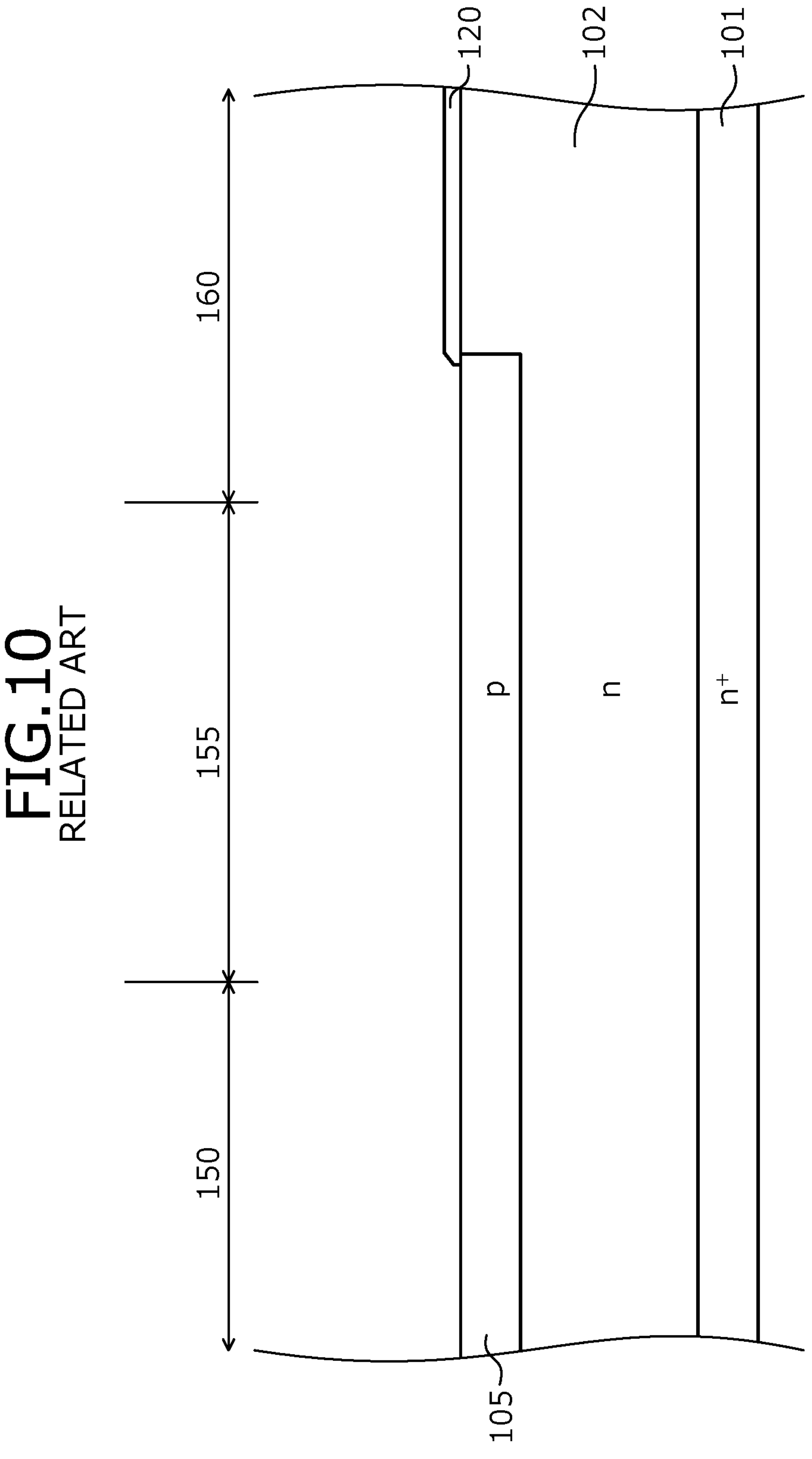
FIG. 10 is a cross-sectional view depicting a state of the conventional semiconductor device during manufacture.

Next, the p-type base layer 105 is formed in an entire area of a surface of the active region 150, an entire area of a surface of the active region outer peripheral portion 155 and a portion of the edge termination region 160, and the field oxide film 120 is formed in a portion of the edge termination region 160. The state up to here is depicted in FIG. 10.

Figure 11:
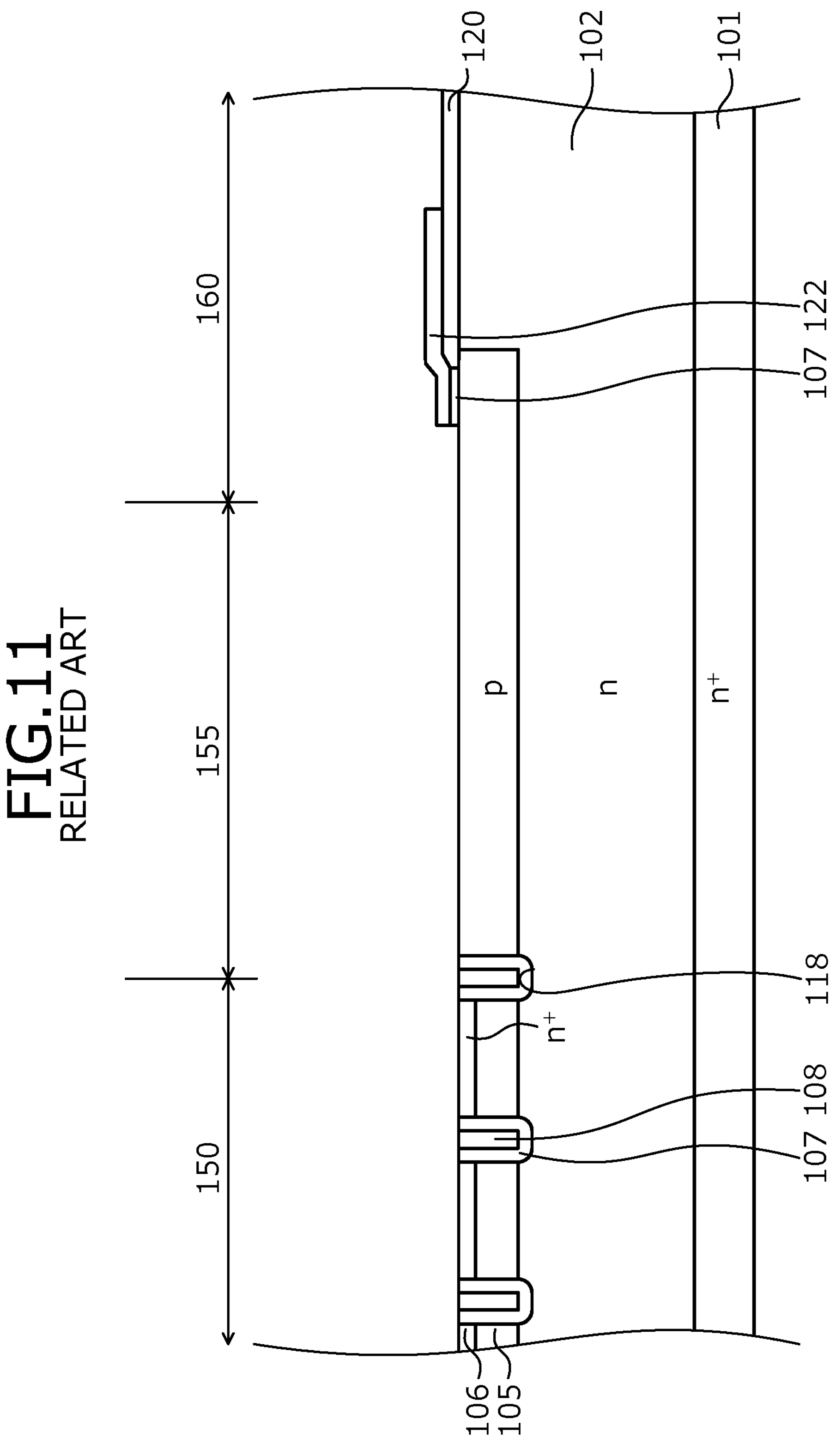
FIG. 11 is a cross-sectional view depicting a state of the conventional semiconductor device during manufacture.

Next, in the active region 150 and the active region outer peripheral portion 155, the gate trenches 118 are formed in the p-type base layer 105. Next, at a surface of the p-type base layer 105, the gate insulating films 107 and a conductive film (Poly-Si) constituting the gate electrodes 108 are formed in the order stated. Next, the gate insulating films 107 and the conductive film are left in the gate trenches 118 and other portions are removed from the surface of the p-type base layer 105. Next, the $n^+$-type source regions 106 are formed by ion implantation in the active region 150, and a heat treatment for activating the $n^+$-type source regions 106 is performed. Here, the $p^{++}$-type contact regions 133 may be formed. As a result, in the edge termination region 160, at least the conductive film 122 is electrically connected to the gate electrodes 108 in the gate trenches 118, and the conductive film 122 is left so as to form a field plate that covers the field oxide film 120. The state up to here is depicted in FIG. 11.

Figure 12:
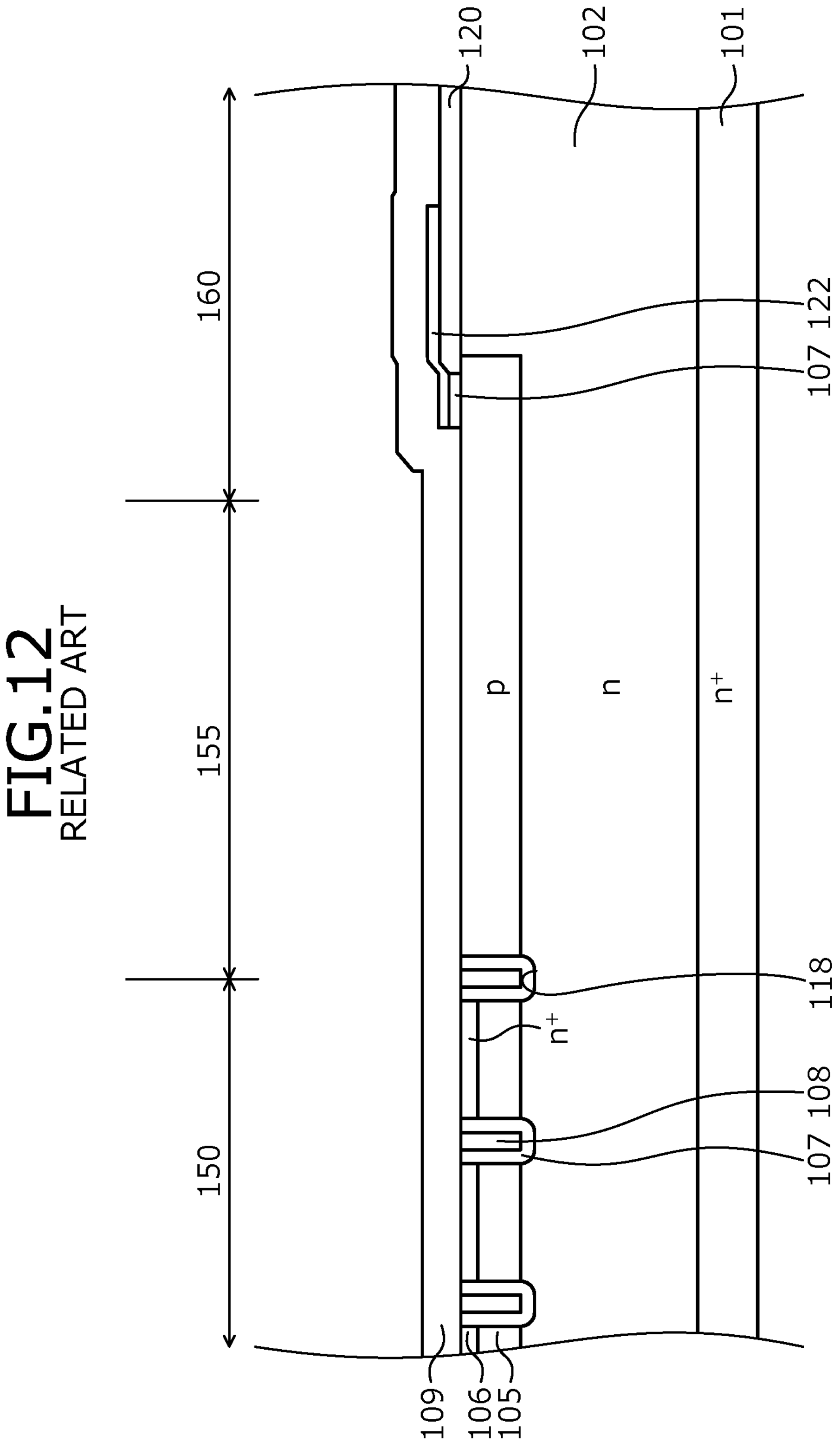
FIG. 12 is a cross-sectional view depicting a state of the conventional semiconductor device during manufacture.
Figure 13:
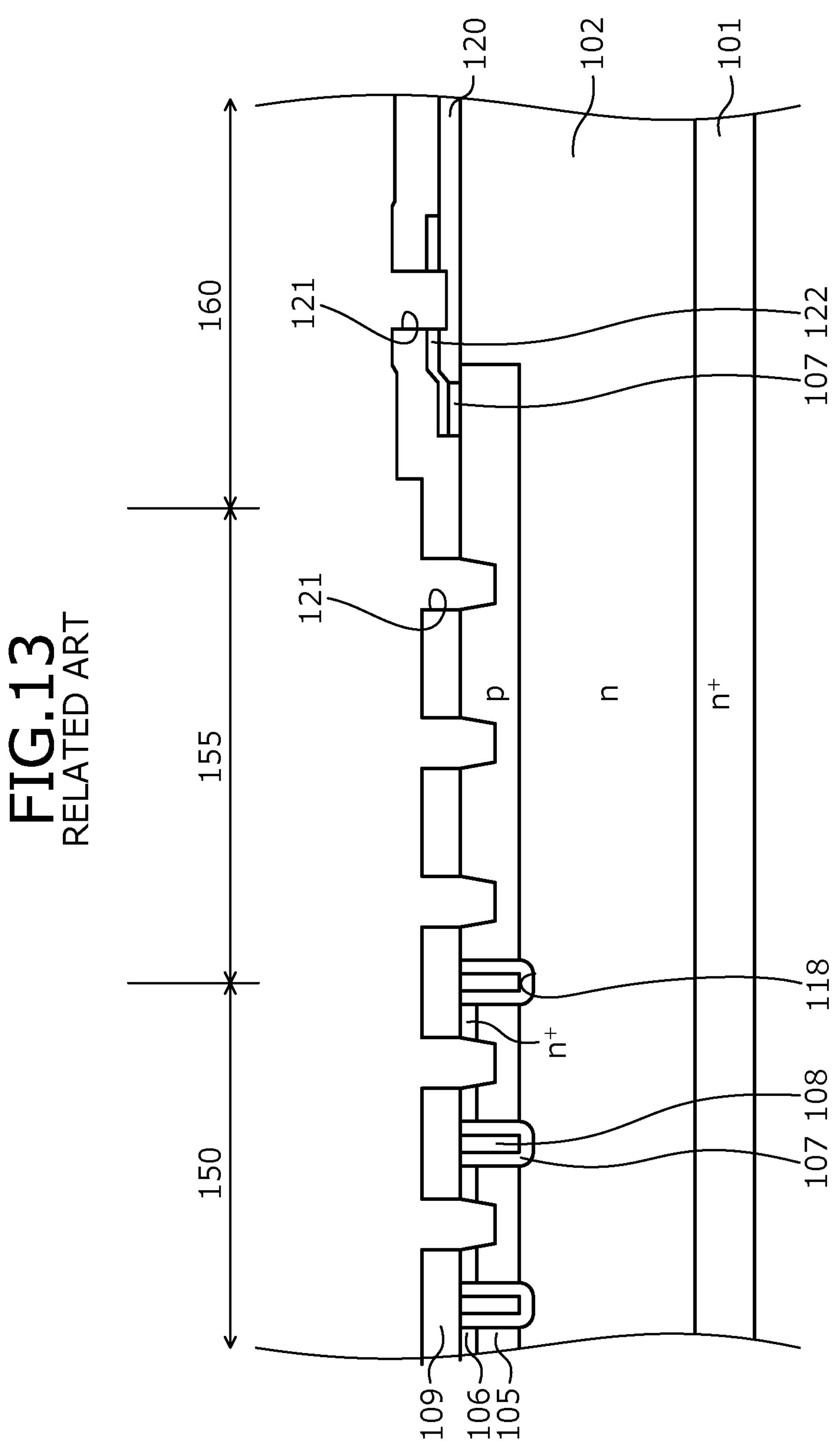
FIG. 13 is a cross-sectional view depicting a state of the conventional semiconductor device during manufacture.

Next, in the active region 150, the active region outer peripheral portion 155, and the edge termination region 160, surfaces thereof are covered by the interlayer insulating film 109. The state up to here is depicted in FIG. 12. Next, contact holes 121 are formed that penetrate through the $n^+$-type source regions 106 and reach the p-type base layer 105 in the active region 150 and the active region outer peripheral portion 155, while in the edge termination region 160, the contact holes 121 reach the conductive film 122. The contact holes 121 of the active region 150 and the active region outer peripheral portion 155 are formed by etching of the p-type base layer 105 (and the $n^+$-type source regions 106) continuous with etching of the interlayer insulating film 109. The contact holes 121 of the active region 150, the active region outer peripheral portion 155, and the edge termination region 160 may be formed concurrently. When etching of the p-type base layer 105 in the active region 150 and the active region outer peripheral portion 155 is performed, an etching rate of the conductive film 122 containing polysilicon is faster than an etching rate of the p-type base layer 105, which contains silicon crystals and thus, the contact holes 121 of the edge termination region 160 penetrate through the conductive film 122, the field oxide film 120 below is exposed by the etching, and the field oxide film 120 is slightly etched (for example, 50 nm to 70 nm). The state up to here is depicted in FIG. 13. Next, a p-type impurity is ion-implanted at bottoms of the contact holes 121, whereby the $p^{++}$-type contact regions 133 are formed.

Figure 14:
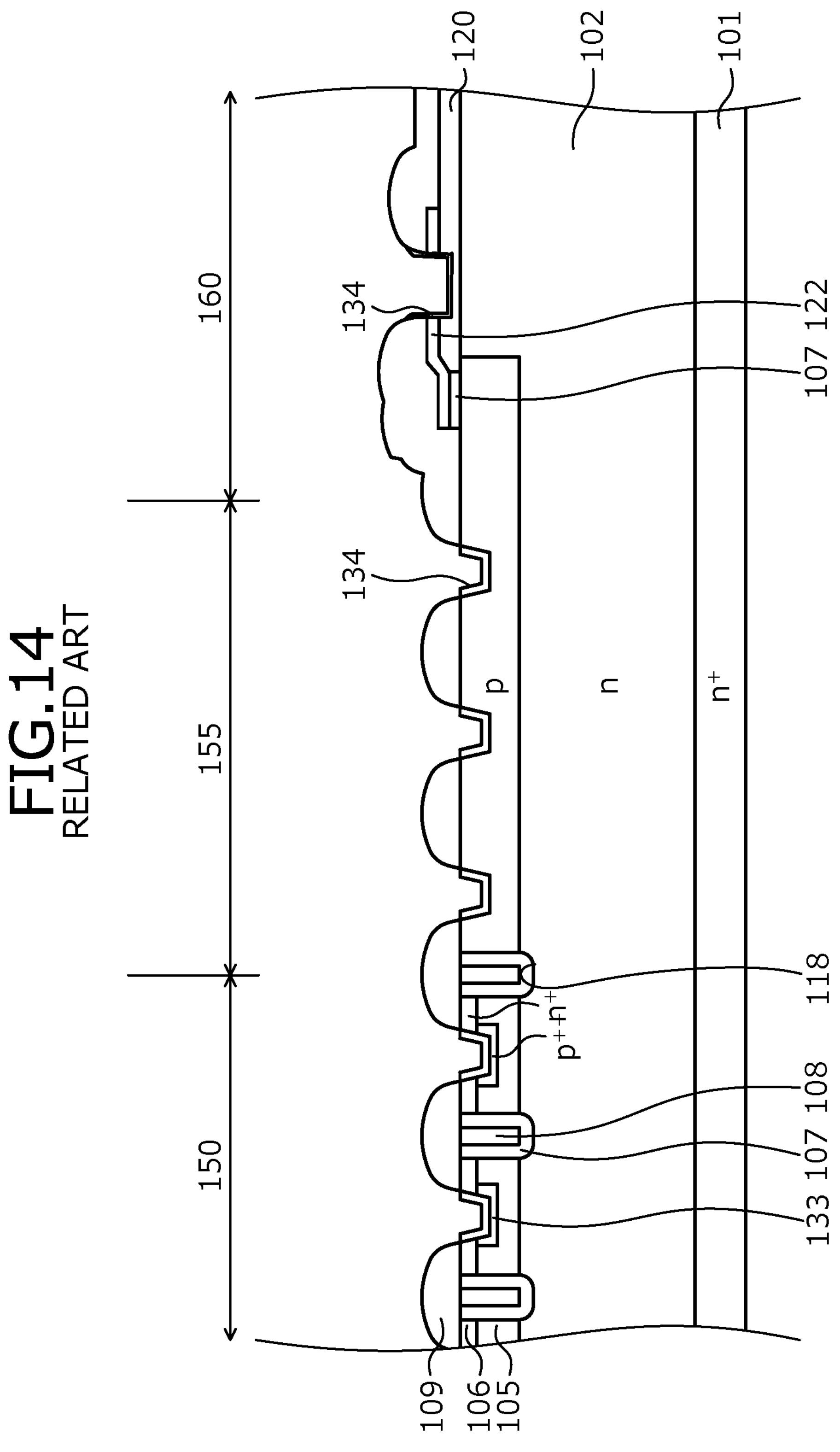
FIG. 14 is a cross-sectional view depicting a state of the conventional semiconductor device during manufacture.

Next, a thick oxide film 134 is formed in the contact holes 121, using a mixed $O_2$ gas. For example, first, a heat treatment is performed under $N_2$ of 9.7 slm and $O_2$ of 0.3 slm for 10 minutes, next, the heat treatment is performed under $N_2$ of 0 slm and $O_2$ of 10 slm for 10 minutes and finally, the heat treatment is performed under $N_2$ of 10 slm and $O_2$ of 0 slm for 10 minutes, whereby the thick oxide film 134 of about, for example, 30 nm to 50 nm is formed. The state up to here is depicted in FIG. 14. Here, the interlayer insulating film 109 contains an n-type impurity such as phosphorus to ensure flatness in formation of the metal electrode after the formation of the contact holes 121. The bottoms of the contact holes 121 are formed by the $n^+$-type source regions 106 in the active region 150, however, in the active region outer peripheral portion 155, the bottoms are formed by the p-type base layer 105 and thus, during the heat treatment, the phosphorus diffuses outward, whereby an n-type inversion layer may be formed, thereby, forming a parasitic transistor, which may run out of control during reverse recovery current inflow and result in destruction. To prevent this, a method is used in which during the heat treatment, Si and $O_2$ are caused to react with each other using a mixed $O_2$ gas and the outward diffusion of the phosphorus is prevented by the thick oxide film 134. The thick oxide film 134 is formed by thermal oxidation and thus, at the contact holes 121 of the edge termination region 160, the field oxide film 120 therebelow and the interlayer insulating film 109 are free of silicon as a material and therefore, substantially no oxide film grows.

Figure 15:
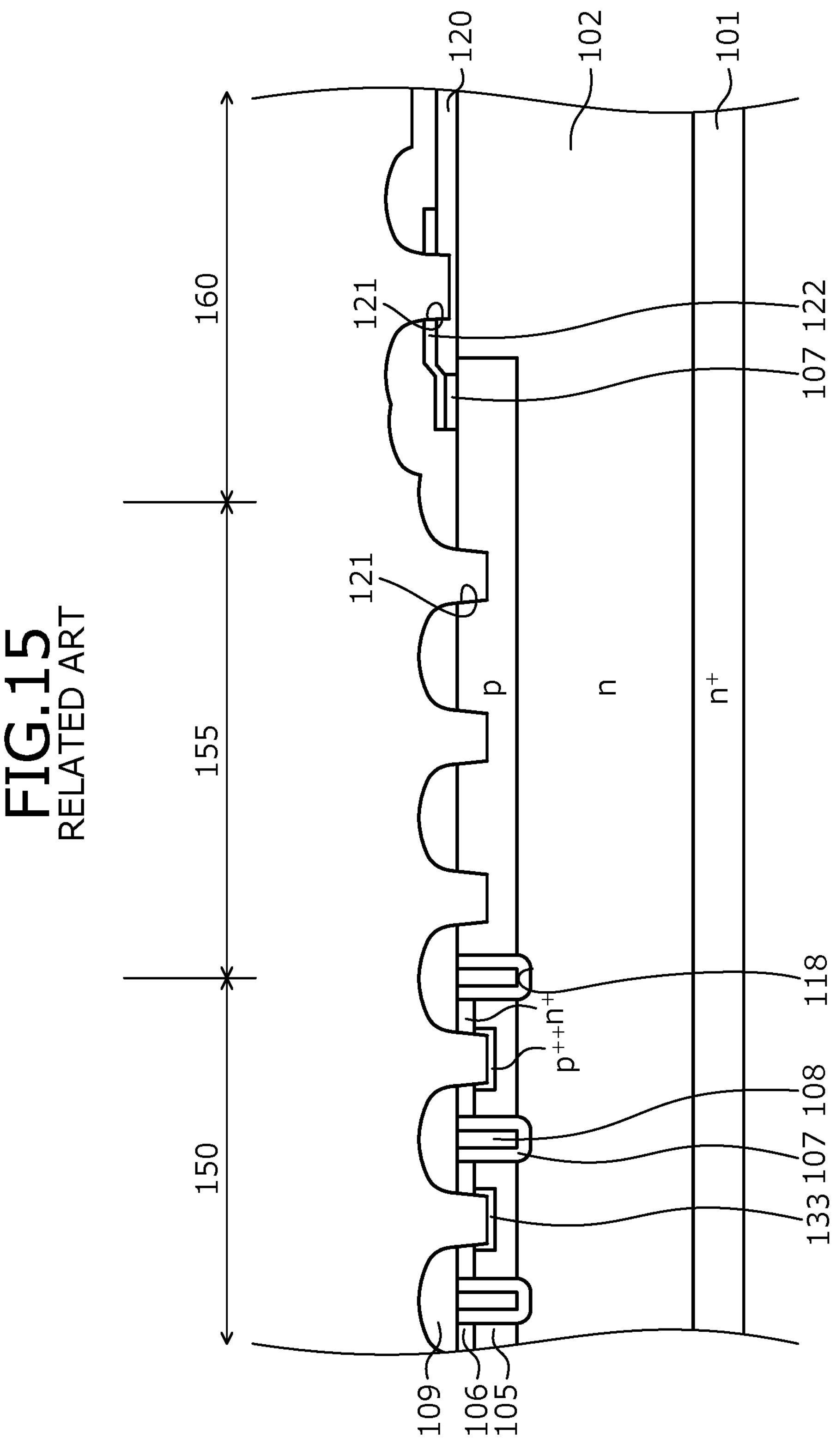
FIG. 15 is a cross-sectional view depicting a state of the conventional semiconductor device during manufacture.

Next, the thick oxide film 134 is removed by etching using hydrofluoric acid or the like. The width of the contact holes 121 is increased by this etching. The state up to here is depicted in FIG. 15. Next, the barrier metal 115 and the contact plugs 114 are formed in the contact holes 121, subsequently, the metal electrodes cover the surface, and the electrodes are separated by the active region 150 and the edge termination region 160, whereby the source electrode 110 and the gate metal electrode 113 are formed. As a result, in the active region 150, the source electrode 110 is connected to the $n^+$-type source regions 106 and the $p^{++}$-type contact regions 133 via the barrier metal 115 and the contact plugs 114. In the active region outer peripheral portion 155, the source electrode 110 is connected to the p-type base layer 105 via the barrier metal 115 and the contact plugs 114. In the edge termination region 160, the gate metal electrode 113 is connected to the conductive film 122 via the barrier metal 115 and the contact plugs 114.

Next, the back electrode 111 is formed at the back surface of the $n^+$-type semiconductor substrate 101, whereby the semiconductor device depicted in FIG. 9 is fabricated.

Nonetheless, when the thick oxide film 134 at sidewalls of the contact holes 121 is etched, the field oxide film 120 below is also etched. For example, in an instance in which a thick oxide film of about 30 nm to 50 nm is provided, with consideration of 50% over-etching, an etching technique capable of removing an oxide film of 45 nm to 75 nm is performed. In this case, 45 nm to 75 nm of the field oxide film 120 therebelow is also removed, becoming even thinner.

Figure 16:
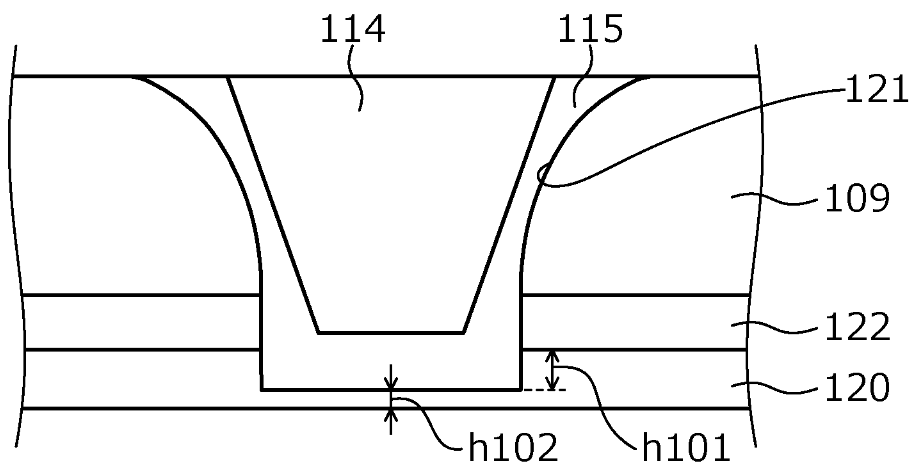
FIG. 16 is a detailed cross-sectional view depicting a structure of the gate metal electrode of the conventional semiconductor device.

FIG. 16 is a detailed cross-sectional view depicting a structure of the gate metal electrode of the conventional semiconductor device. As depicted in FIG. 16, at the bottoms of the contact holes 121, loss h101 of the field oxide film 120 increases and a remaining thickness h102 of the field oxide film 120 decreases. For example, the thickness of the field oxide film 120 is 350 nm, the loss h101 is in a range of 95 nm to 145 nm, and the remaining thickness h102 of the portions at the bottoms of the contact holes 121 is in a range of 205 nm to 255 nm.

As a result, electric field at a lower portion of the field oxide film 120 easily increases and a function of the field oxide film 120 may decrease. A problem arises in that to prevent this, introduction and management of equipment with high contact etching controllability are necessary to increase the thickness of the polysilicon and suppress contact penetration, nonetheless, in this case, the contact formation process is performed separately on the field oxide film 120 and cost and flatness degrades.

A semiconductor device and a method of manufacturing a semiconductor device according to an embodiment, that solve the problems discussed above are described. FIG. 1 is a cross-sectional view depicting a structure of the semiconductor device according to the embodiment. The structure of the semiconductor device according to the embodiment is described taking a trench-type MOSFET 70 as an example.

The trench-type MOSFET 70 is a MOSFET having, in a front side (side having a later-described p-type base layer 5) of a semiconductor base (silicon base: semiconductor chip) that contains silicon (Si), a metal oxide semiconductor (MOS) gate. The trench-type MOSFET 70 has an active region 50, an active region outer peripheral portion 55, and an edge termination region 60 that surrounds the active region 50 and a periphery of the active region outer peripheral portion 55. The active region 50 and the active region outer peripheral portion 55 are regions through which current flows in an on-state. The edge termination region 60 includes a breakdown voltage sustaining region that mitigates electric field of a semiconductor-base front portion of a drain region and sustains a breakdown voltage. The MOS structure is provided in the active region 50 while the active region outer peripheral portion 55 is free of the MOS structure.

A border between the active region 50 and the active region outer peripheral portion 55 is a center of one of multiple trenches 18, the one having only one side in contact with one of multiple later-described $n^+$-type source regions 6. A border between the active region outer peripheral portion 55 and the edge termination region 60 is an end of a later-described source electrode 10. In FIG. 1, three unit cells (functional units of a device) are depicted in the active region 50 while other unit cells adjacent to these unit cells are not depicted. Here, a unit cell is from the center of any one of the trenches 18 to the center of an adjacent one of the trenches 18.

An $n^+$-type semiconductor substrate (semiconductor substrate of a first conductivity type) 1 is a single crystal silicon substrate doped with, for example, arsenic (As) or phosphorus (P). On the $n^+$-type semiconductor substrate 1, an n-type drift layer (drift layer of the first conductivity type) 2 is provided. The n-type drift layer 2 has an impurity concentration that is lower than an impurity concentration of the $n^+$-type semiconductor substrate 1 and, for example, is a low-concentration n-type layer doped with phosphorus. Hereinafter, the $n^+$-type semiconductor substrate 1 and the n-type drift layer 2 combined are regarded as the semiconductor base. On the $n^+$-type semiconductor substrate 1, an n-type buffer layer (not depicted) may be disposed having an impurity concentration that is lower than the impurity concentration of the $n^+$-type semiconductor substrate 1. The n-type buffer layer is, for example, a low-concentration n-type layer doped with phosphorus. In the semiconductor base, at the front side thereof, a MOS gate structure (device structure) is formed. Further, at a back surface of the semiconductor base, a back electrode 11 constituting a drain electrode is provided.

Further, a p-type base layer (base layer of a second conductivity type) 5 is provided in a surface layer of the n-type drift layer 2 and the $n^+$-type source regions (source regions of the first conductivity type) 6 are selectively provided in a surface layer of the p-type base layer 5. In the surface layer of the p-type base layer 5, $p^{++}$-type contact regions 33 that are in contact with the $n^+$-type source regions 6 may be provided.

In the semiconductor base, at a first main surface thereof (surface having the p-type base layer 5), a trench structure is formed. The trench structure is configured by the trenches 18, gate insulating films 7, and gate electrodes 8. In particular, the trenches 18 penetrate through the p-type base layer 5 and the $n^+$-type source regions 6 from a first surface (side of the semiconductor base having the first main surface) of the p-type base layer 5, opposite to a second surface of the p-type base layer 5 facing the $n^+$-type semiconductor substrate 1 and reach the n-type drift layer 2. Along inner walls of the trenches 18, the gate insulating films 7 are formed at bottoms and sidewalls of the trenches 18, and the gate electrodes 8 are provided on the gate insulating films 7 in the trenches 18. The gate electrodes 8 are insulated from the p-type base layer 5 by the gate insulating films 7. A portion of each of the gate electrodes 8 may protrude in a direction toward the source electrode 10, from upper portions of the trenches 18 (side where the later-described source electrode 10 is provided).

The interlayer insulating film 9 is provided in an entire area of the first main surface of the semiconductor base so as to cover the gate electrodes 8 embedded in the trenches 18. The source electrode 10 is in contact with the $n^+$-type source regions 6 and the p-type base layer 5 via contact holes formed in the interlayer insulating film 9. In the p-type base layer 5, at the surface thereof in contact with the source electrode 10 via the contact holes, the $p^{++}$-type contact regions 33 may be provided. The source electrode 10 is electrically insulated from the gate electrodes 8 by the interlayer insulating film 9. Between the source electrode 10 and the interlayer insulating film 9, for example, a barrier metal 15 that prevents diffusion of metal atoms from the source electrode 10 to the gate electrodes 8 may be provided.

Further, contact plugs 14 may be provided in the contact holes formed in the interlayer insulating film 9. The contact plugs 14, for example, are metal films having, as a material, tungsten (W) which has high embeddability. Here, a trench contact structure is preferable because, during avalanche operation, holes of the p-type base layer 5 are pulled out at a position deeper than are positions of the $n^{+}$-type source regions 6, whereby parasitic bipolar operation may be suppressed. Herein, the trench contact structure is a contact structure in which trenches that penetrate through the $n^{+}$-type source regions 6 and are in contact with the $p^{++}$-type contact regions 33 are provided; contact holes penetrate through the interlayer insulating film 9 and the $n^{+}$-type source regions 6 and are provided so as to be in contact with the $p^{++}$-type contact regions 33. On the source electrode 10, a protective film (not depicted) such as a passivation film containing, for example, a polyimide is selectively provided.

Further, in the edge termination region 60, which sustains the breakdown voltage, the gate insulating films 7 and a field oxide film 20 are provided in the semiconductor base, at the front surface thereof, and on the field oxide film 20, a conductive film 22 constituted by a polycrystalline silicon film connected to the gate electrodes 8 is provided. The interlayer insulating film 9 is provided on the semiconductor base and the conductive film 22. On the conductive film 22, a gate metal electrode 13 electrically connected to a gate electrode pad (not depicted) is provided. The gate metal electrode 13 is in contact with the conductive film 22 via a contact hole formed in the interlayer insulating film 9 and is insulated from the semiconductor base by the field oxide film 20. Between the gate metal electrode 13 and the interlayer insulating film 9, for example, the barrier metal 15 that prevents diffusion of metal atom from the gate metal electrode 13 to the gate electrodes 8 may be provided. Further, the contact plugs 14 may be embedded in the contact holes formed in the interlayer insulating film 9. The contact plugs 14, for example, are metal films containing, as a material, tungsten (W), which has high embeddability.

Further, in the edge termination region 60, a voltage withstanding structure constituted by a $p^{--}$-type RESURF region, a p-type guard ring, etc. may be provided. A channel stopper (not depicted) is provided closer to an end of the semiconductor base than is the voltage withstanding structure and a field plate (not depicted) may be provided on the channel stopper which is of an n-type. The $p^{--}$-type RESURF region and the channel stopper may be provided in annular shapes in an outer periphery of the chip.

Figure 2:
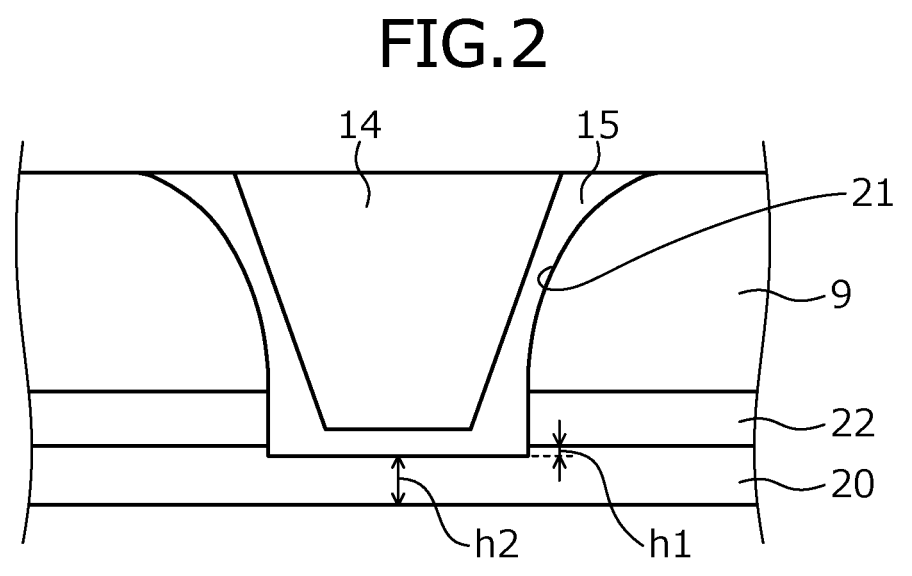

FIG. 2 is a detailed cross-sectional view depicting a structure of the gate metal electrode of the semiconductor device according to the embodiment. In the semiconductor device according to the embodiment, loss of the field oxide film 20 at bottoms of contact holes 21 fabricated by a later-described method of manufacturing is less than that of the conventional semiconductor device. In FIG. 2, while an upper portion of the interlayer insulating film 9 has a portion that is not covered by the barrier metal 15, an entire area of the surface of the upper portion of the interlayer insulating film 9 may be covered by the barrier metal 15.

As depicted in FIG. 2, in the semiconductor device according to the embodiment, a thickness of portions of the field oxide film 20 in the contact holes 21 is at most equal to a thickness of portions thereof outside of the contact holes 21. A reason that the thickness of portions of the field oxide film 20 in the contact holes 21 is at most equal to the thickness of portions thereof outside the contact holes 21 is as follows. The contact holes 21 of the active region 50 and the active region outer peripheral portion 55 are formed by performing etching of the p-type base layer 5 (and the source regions 6) continuous with etching of the interlayer insulating film 9. The contact holes 21 of the active region 50, the active region outer peripheral portion 55, and the edge termination region 60 may be formed concurrently. Thus, when the etching of the p-type base layer 5 in the active region 50 and the active region outer peripheral portion 55 is performed, in the contact holes 21 of the edge termination region 60, the conductive film 22 containing polysilicon is penetrated, the field oxide film 20 therebelow is exposed by the etching and is slightly etched and becomes thinner (for example, 50 nm to 70 nm). Additionally, a later-described thin oxide film 34 (refer to FIG. 7) is formed and thereafter, the thin oxide film 34 is removed and thus, the field oxide film 20 becomes thinner.

A loss h1 due to the formation of the contact holes 21 is in a range of 50 nm to 70 nm and an increase of the loss h1 due to the thin oxide film 34 (refer to FIG. 7) being formed and thereafter being removed is at least 3.75 nm but less than 15 nm. A reason that the increase of the loss h1 is at least 3.75 nm but less than 15 nm is that the thin oxide film 34 (refer to FIG. 7) has a thickness in a range of 2.5 nm to 10 nm and in the removal of the oxide film 34, an etching process of etching 1.5 times is performed with consideration of in-plane distribution, etc., and when the thickness of the thin oxide film 34 is 2.5 nm, the loss amount is 3.75 nm, and when the thickness is 10 nm, the loss amount is 15 nm.

Therefore, the loss h1 is in a range of 53.75 nm to 85 nm. With consideration of in-plane distribution and process variation, the loss h1 may be in a range of 54 nm to 85 nm. A remaining thickness h2 of portions of the contact holes 121 at the bottoms thereof may be in a range of 265 nm to 296 nm. As such, a thickness of the field oxide film below the contact hole is 15.4%-24.3% thinner than a thickness of the field oxide film outside the contact hole.

On the other hand, the loss h101 of the field oxide film 120 of the conventional semiconductor device is in a range of 95 nm to 145 nm (refer to FIG. 16). Respective thicknesses of the field oxide films 20, 120 are the same conventionally and in the embodiment and thus, the remaining thickness h2 of the field oxide film 20 of the embodiment is greater than the remaining thickness h102 of the field oxide film 120 conventionally. Therefore, in the semiconductor device according to the embodiment, without increases in the electric field at the bottom of the field oxide film 20 and without degradation of function as the field oxide film 20, separately performing a contact formation process on the field oxide film 20, increasing the thickness of the polysilicon, and a need for introducing and managing equipment having high contact etching controllability are eliminated.

Next, a method of manufacturing a semiconductor device according to the embodiment is described. FIGS. 3, 4, 5, 6, 7, and 8 are cross-sectional views depicting states of the semiconductor device according to the embodiment during manufacture. First, the $n^{+}$-type semiconductor substrate 1 containing silicon and constituting the $n^{+}$-type drain layer is prepared. Next, on the front surface of the $n^{+}$-type semiconductor substrate 1, the n-type drift layer 2 having an impurity concentration that is lower than the impurity concentration of the $n^+$-type semiconductor substrate 1 is epitaxially grown.

Figure 3:
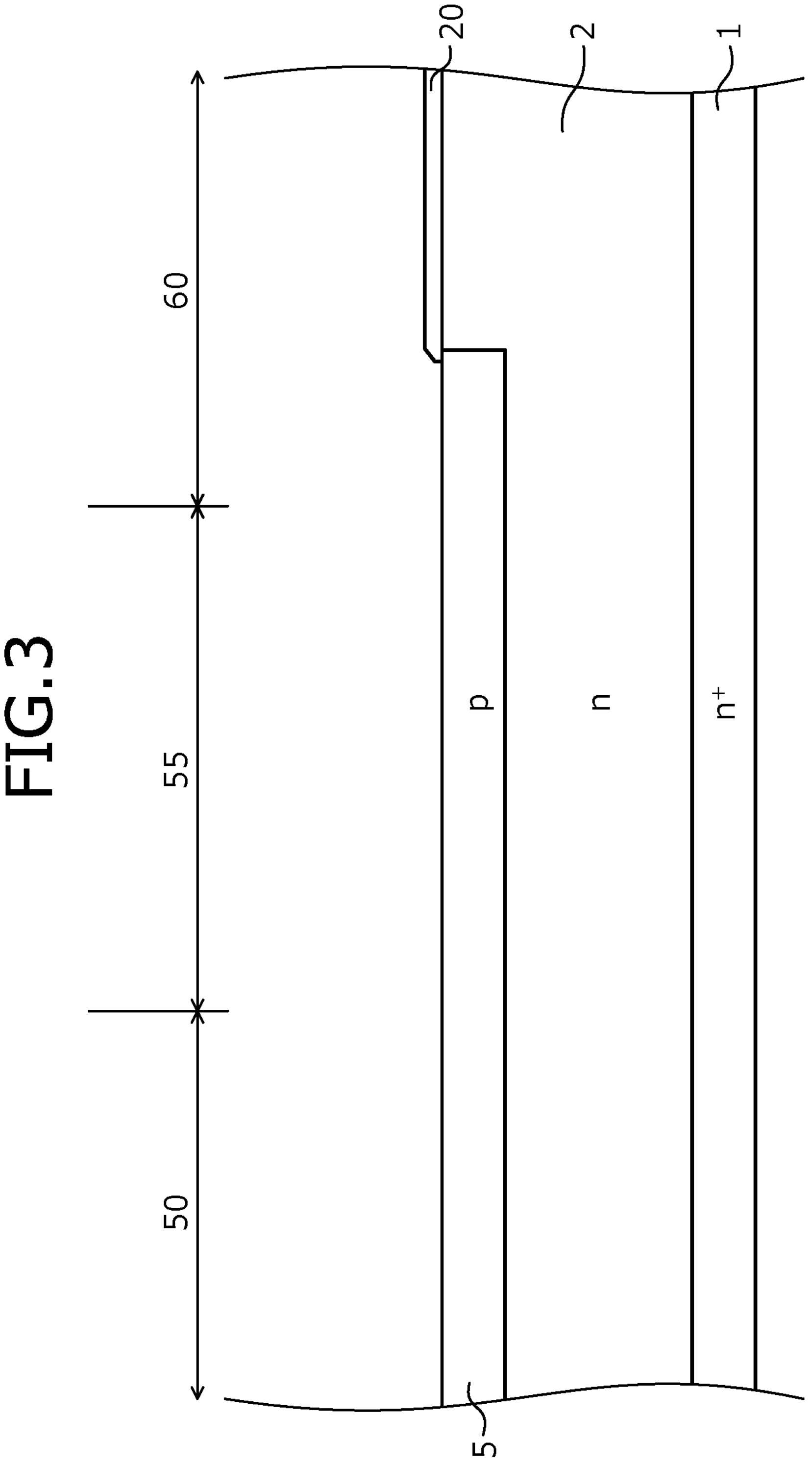
FIG. 3 is a cross-sectional view depicting a state of the semiconductor device according to the embodiment during manufacture.

Next, at the surface of the n-type drift layer 2, an oxide film mask is formed in a predetermined location by a photolithographic technique and an etching technique. Next, ion-implantation of a p-type impurity, for example, boron (B) is performed using the formed oxide film mask as a mask. The oxide film mask constitutes the field oxide film 20. Next, by oxidation diffusion, the p-type base layer 5 is formed at the surface layer of the n-type drift layer. Oxidation of the field oxide film 20 to a predetermined thickness and diffusion that forms the p-type base layer 5 may be performed together. The state up to here is depicted in FIG. 3. Concurrently, the channel stopper may be formed at the surface of the n-type drift layer 2, at an end portion (side opposite to the active region 50) of the edge termination region 60. The channel stopper may be an n-type or may be a p-type. The channel stopper may be formed by ion-implanting an n-type impurity, for example, phosphorus (P) or a p-type impurity, for example, boron (B), and thereafter, performing oxidation diffusion. Next, in the n-type drift layer 2, at the surface thereof and in the edge termination region 60, at a side thereof facing the active region 50, ion-implantation of a p-type impurity, for example, boron (B) and thereafter, oxidation diffusion may be performed, whereby the $p^{--}$-type RESURF region may be formed.

Next, the oxide film formed on the surface of the p-type base layer 5 during the oxidation diffusion described above is formed by photolithography into an oxide film mask (not depicted) for the trenches having a predetermined opening width. Next, the trenches 18 that reach the n-type drift layer 2 are formed by dry etching.

Next, with the oxide film mask on, isotropic etching for removing damage of the trenches 18 and/or sacrificial oxidation for rounding corners of the openings of the trenches 18 and the bottoms of the trenches 18 are performed. Either the isotropic etching or the sacrificial oxidation alone may be performed. Further, the isotropic etching may be performed and thereafter, the sacrificial oxidation may be performed. The oxide film mask is removed concurrently with an oxide film formed by the sacrificial oxidation.

Next, the gate insulating films 7 are formed along the surface of the p-type base layer 5 and the bottoms and sidewalls of the trenches 18. The gate insulating films 7 may be formed by thermal oxidation of about 1000 degrees C. under an oxygen atmosphere. Further, the gate insulating films 7 may be formed by a deposition method by a chemical reaction such as that for a high temperature oxide (HTO).

Next, on the gate insulating films 7, for example, polysilicon constituted by a polycrystalline silicon (Poly-Si) layer doped with phosphorus ions is formed. Next, a portion of the active region 50 is etched, thereby leaving portions of the polysilicon that constitute the gate electrodes 8 in the trenches 18 and leaving a portion of the polysilicon constituting the conductive film 22 in the edge termination region 60. At this time, the polysilicon embedded in the trenches 18 are etched back and may be etched so as to be left, in the trenches 18, below the surface of the n-type drift layer 2 or may be patterned and etched so as to protrude outward from the surface of the n-type drift layer 2. Thus, in the edge termination region 60, at least the polysilicon is electrically connected to the gate electrodes 8 in the trenches 18 and the conductive film 22 is left so as to form a field plate that covers the field oxide film 20.

Figure 4:
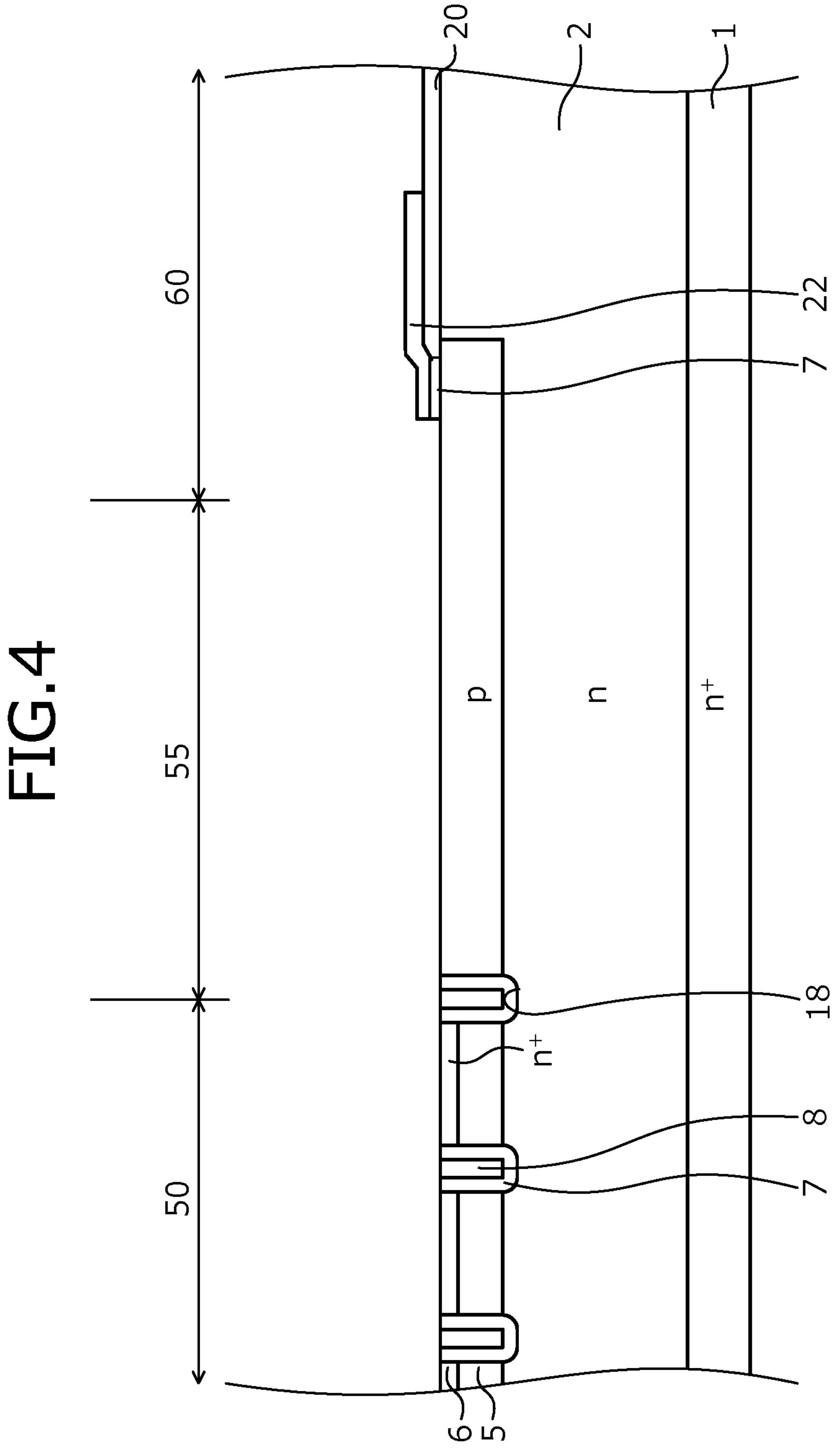
FIG. 4 is a cross-sectional view depicting a state of the semiconductor device according to the embodiment during manufacture.

Next, on the surface of the p-type base layer 5, a mask having predetermined openings is formed by a photolithographic technique using, for example, a resist. Subsequently, ion implantation is performed using the resist as a mask, whereby an n-type impurity is ion-implanted. As a result, in surface regions of the p-type base layer 5, the $n^+$-type source regions 6 are formed. Next, the mask used during the ion implantation for forming the $n^+$-type source regions 6 is removed. The state up to here is depicted in FIG. 4. Next, a heat treatment for activating the $n^+$-type source regions 6 is performed.

In the method of manufacturing described, while the gate structure configured by the trenches 18, the gate insulating films 7, and the gate electrodes 8 is formed after the p-type base layer 5 is formed, the p-type base layer 5 may be formed after the gate structure is formed. Formation of the p-type base layer 5 after the formation of the gate structure may facilitate adjustment of the concentration of the p-type base layer 5. Further, the gate structure configured by the trenches 18, the gate insulating films 7, and the gate electrodes 8 may be formed after the $n^+$-type source regions 6 are formed.

Figure 5:
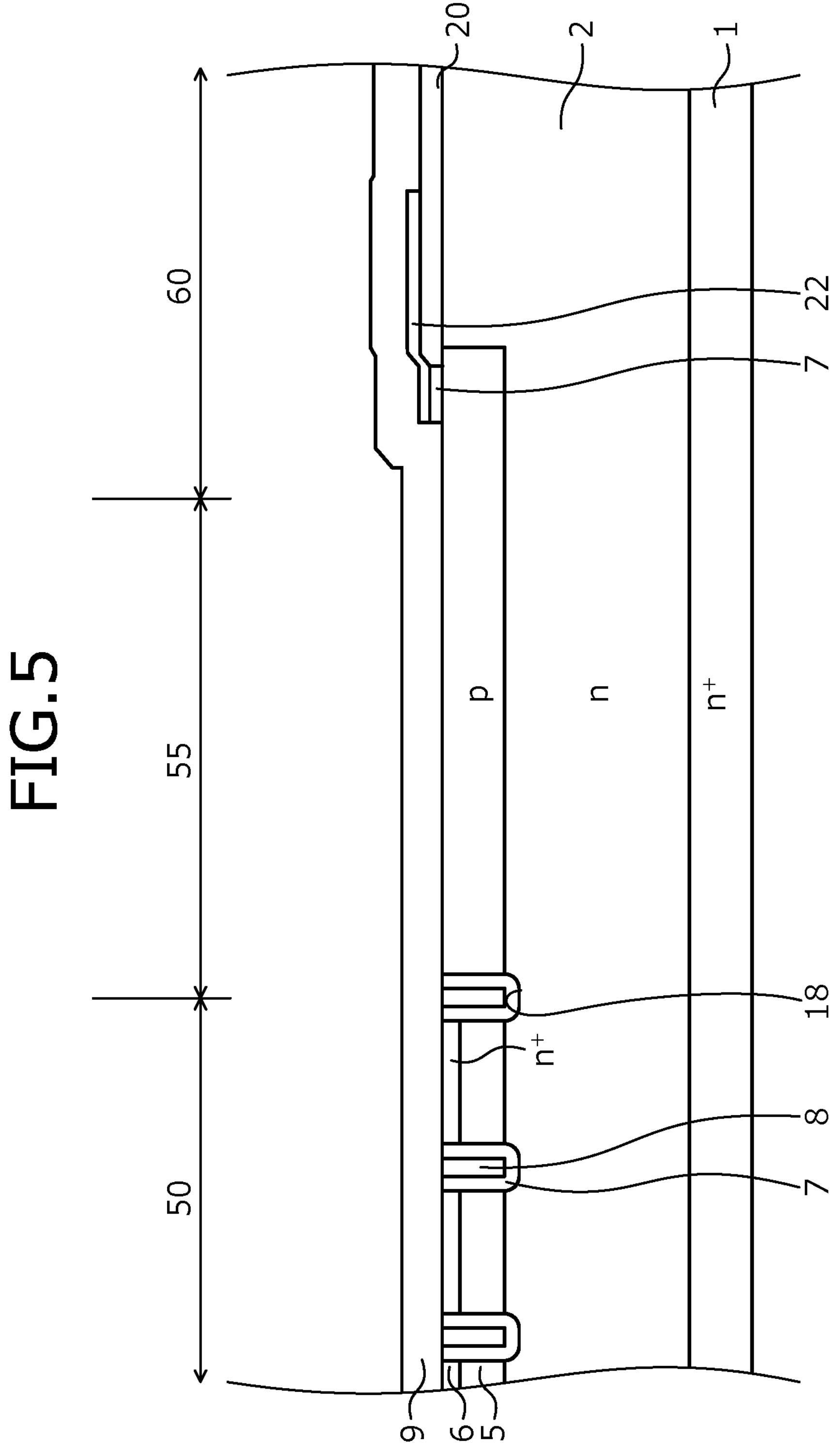
FIG. 5 is a cross-sectional view depicting a state of the semiconductor device according to the embodiment during manufacture.
Figure 6:
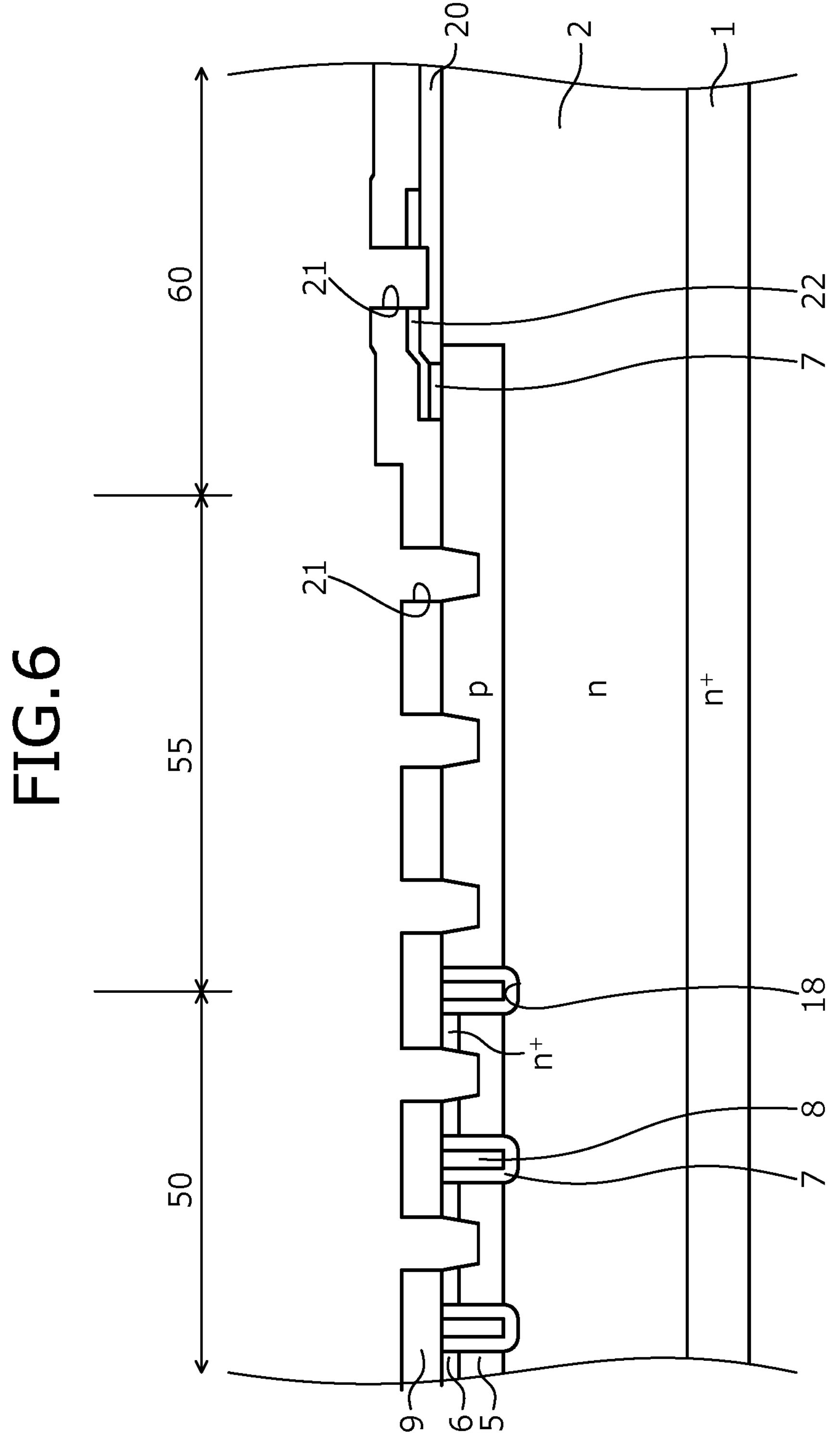
FIG. 6 is a cross-sectional view depicting a state of the semiconductor device according to the embodiment during manufacture.

Next, the interlayer insulating film 9 containing, for example, a phosphate glass and having a thickness of about 1 μm is formed so as to cover the gate electrodes 8. The state up to here is depicted in FIG. 5. Next, the interlayer insulating film 9 is patterned by photolithography and the contact holes 21 that expose the $n^+$-type source regions 6 and the p-type base layer 5 are formed. In the active region 50 and the active region outer peripheral portion 55, the contact holes 21 penetrate through the $n^+$-type source regions 6 and reach the p-type base layer 5 while in the edge termination region 60, the contact holes reach the conductive film 22. The state up to here is depicted in FIG. 6.

Next, in the p-type base layer 5, at the surface thereof exposed by the contact holes 21, a p-type impurity may be ion-implanted, thereby forming the $p^{++}$-type contact regions 33. The $p^{++}$-type contact regions 33 may be formed directly after the $n^+$-type source regions 6 are formed and the contact holes 21 may be formed so as to penetrate through the interlayer insulating film 9 and the $n^+$-type source regions 6 and reach the $p^{++}$-type contact regions 33.

Figure 7:
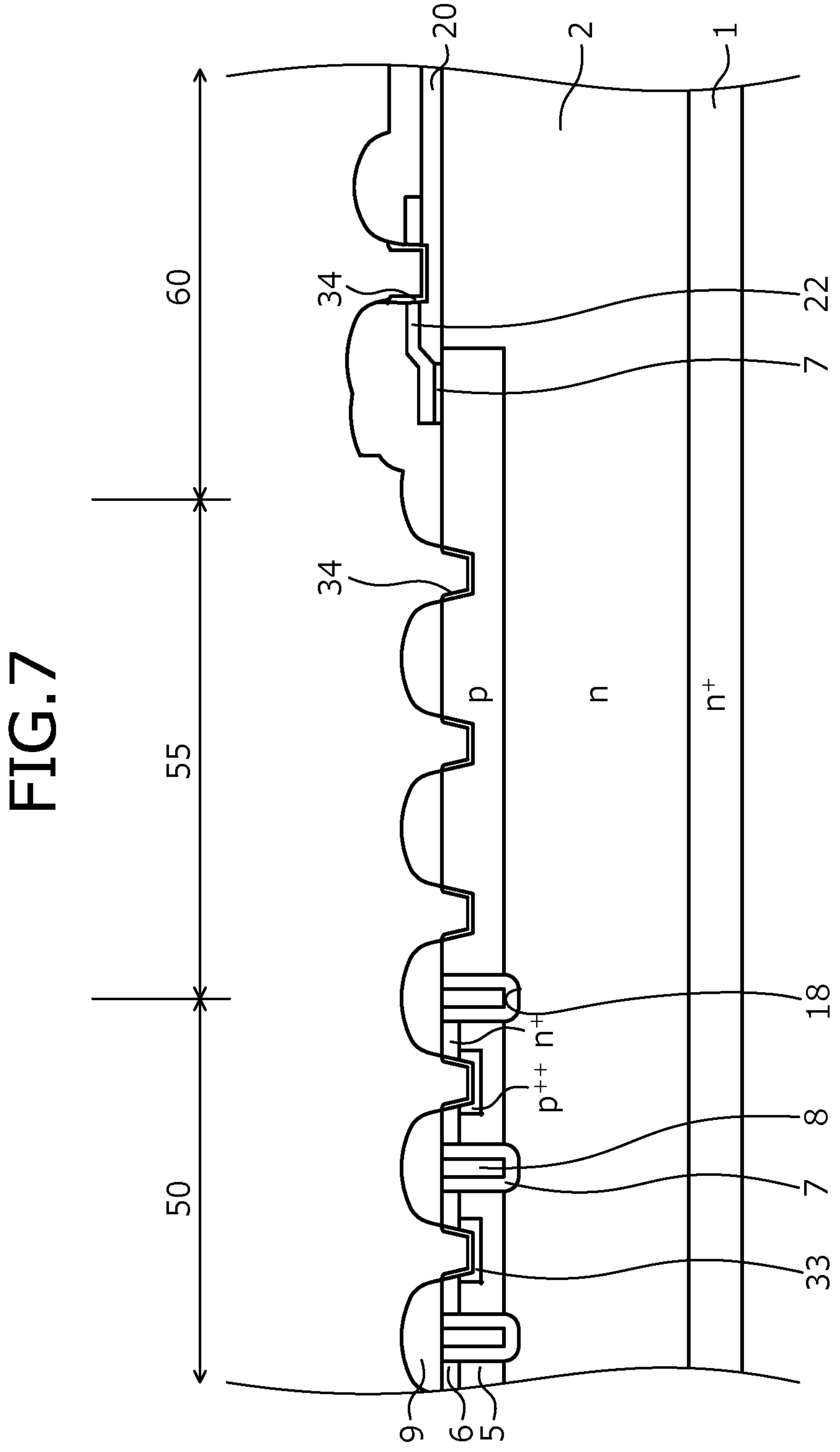
FIG. 7 is a cross-sectional view depicting a state of the semiconductor device according to the embodiment during manufacture.

Next, to round the corners of the openings of the contact holes 21, $O_2$-rapid thermal annealing (RTA) is used and the thin oxide film 34 is formed in the contact holes 21. The state up to here is depicted in FIG. 7. Here, in the $O_2$-RTA, the heat treatment is performed using an $O_2$ mixed gas containing oxygen ($O_2$) only at first, and during the treatment period thereafter, the $O_2$ is cut. For example, first, heating is performed for 15 seconds to 60 seconds at a temperature of in a range of 920 degrees C. to 1100 degrees C. in an $O_2$ mixed gas (first gas) and thereafter, heat treatment is performed for about 30 minutes by a gas (second gas) free of $O_2$ and containing only $N_2$. The $O_2$ mixed gas may be a gas containing 100% $O_2$.

To prevent diffusion of phosphorus into the Si, the thickness of the thin oxide film 34 has to be about 2.5 nm. Therefore, the period of the heat treatment in the $O_2$ mixed gas has to be at least about 15 seconds to form the thin oxide film 34 having a thickness of about 2.5 nm. Further, to reduce the loss of the field oxide film 20, the thickness of the thin oxide film 34 has to be about 10 nm or less and the period of the heat treatment in the $O_2$ mixed gas has to be 60 seconds or less.

Here, the interlayer insulating film 9 contains an n-type impurity such as phosphorus to ensure flatness in the formation of the metal electrode after the contact holes 21 are formed. The bottoms of the contact holes 21 are formed by the $n^+$-type source regions 6 in the active region 50 and are formed by the p-type base layer 5 in the active region outer peripheral portion 55 and thus, phosphorus diffuses outward during heat treatment, whereby an n-type inversion layer may be formed, thereby, forming a parasitic transistor, which may run out of control during reverse recovery current inflow and result in destruction. To prevent this, a rapid heat treatment by $O_2$ is performed only at the beginning of the heat treatment and then, before diffusion of phosphorus to the Si progresses, the thin oxide film 34 is formed that while being thin in a range of 2.5 nm to 10 nm, prevents outward diffusion as much as possible, whereby the outward diffusion of phosphorus us prevented.

Figure 8:
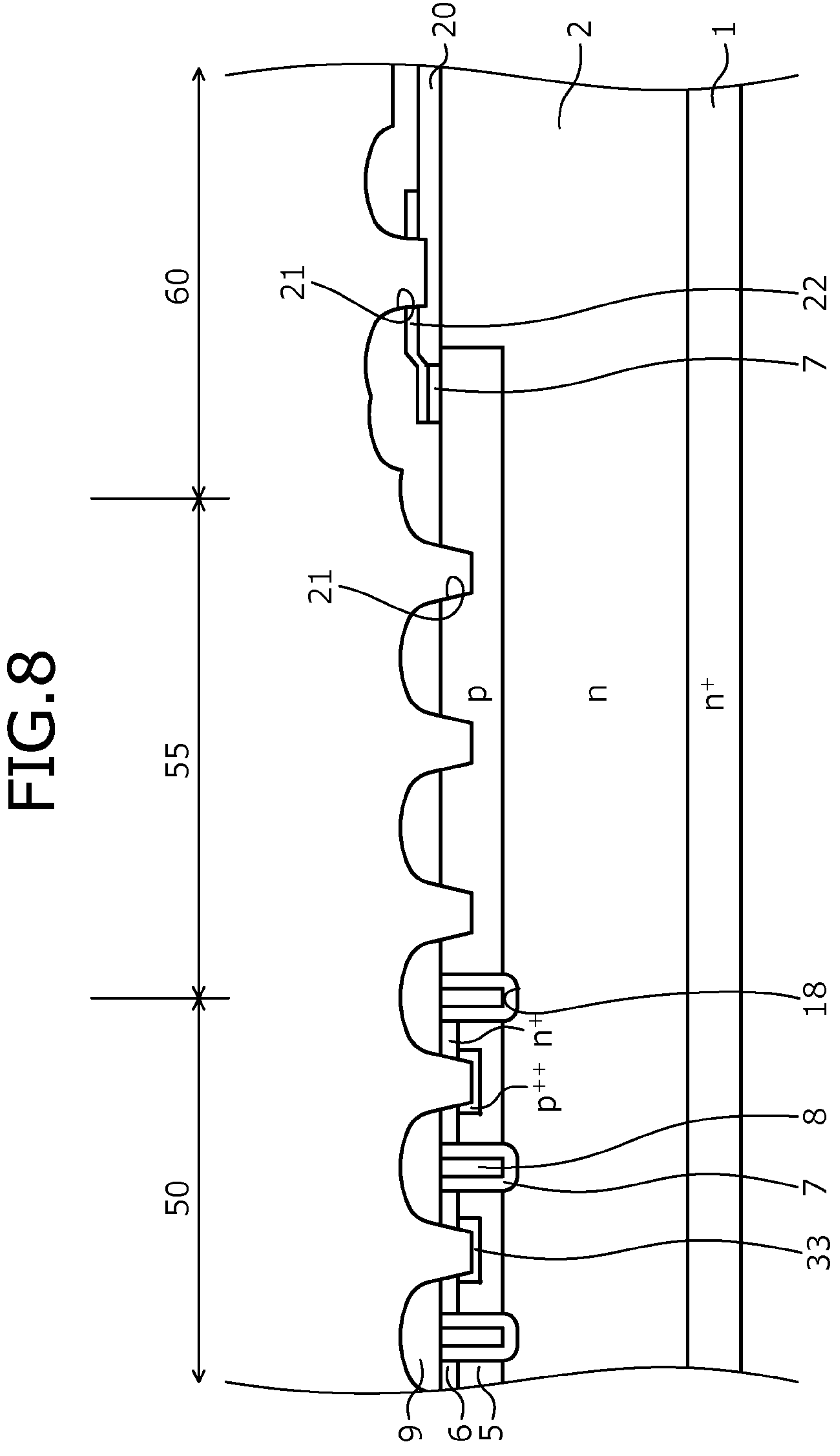
FIG. 8 is a cross-sectional view depicting a state of the semiconductor device according to the embodiment during manufacture.

Next, the thin oxide film 34 is removed by, for example, hydrofluoric acid etching. The contact holes 21 are not significantly widened by the etching. The state up to here is depicted in FIG. 8. In the case of the embodiment, when the conductive film 22 formed in the edge termination region 60 is polysilicon, the polysilicon is rougher than Si and thus, while the etching rate is higher, the thin oxide film 34 at the sidewalls of the contact holes 21 is extremely thin and therefore, during the etching, even when the contact holes 21 penetrate to the field oxide film 20 therebelow, the loss of the field oxide film 20 may be reduced. Therefore, the field oxide film 20 may be sufficiently left and the function of the field oxide film 20 is not affected. Further, even when the barrier metal 15 is used as a surface electrode, the shape is more favorable than a conventional gate contact portion and thus, covering of the metal is stable.

Next, a metal film of aluminum or an alloy containing aluminum as a main constituent is formed by sputtering. Next, the metal film is separated from an electrode by the active region 50 and the edge termination region 60, whereby the source electrode 10 and the gate metal electrode 13 are formed. Before the metal film is formed, the barrier metal 15 constituted by a titanium film (Ti), a titanium nitride film (TiN), or a stacked film thereof (for example, Ti/TiN or the like) may be formed by sputtering. In the contact holes, the contact plugs 14 may be embedded via the barrier metal 15. A material of the contact plugs 14 may be tungsten (W). The contact plugs 14 may be formed by forming a tungsten film by a CVD technique and subsequently, etching the tungsten film. During the etching, the barrier metal may also be etched, or the barrier metal may be left without etching. At this time, use of the trench contact structure may suppress parasitic bipolar operation and therefore, is desirable. Here, the trench contact structure is a contact structure in which the contact plugs 14 are embedded in the contact holes that penetrate through the interlayer insulating film 9 and the $n^+$-type source regions 6 and are in contact with the $p^{++}$-type contact regions 33. As a result, in the active region 50, the source electrode 10 is connected to the $n^+$-type source regions 6 and the $p^{++}$-type contact regions 33 via the barrier metal 15 and the contact plugs 14 formed in contact holes (first contact holes) 21. In the active region outer peripheral portion 55, the source electrode 10 is connected to the p-type base layer 5 via the barrier metal 15 and the contact plugs 14 in contact holes (first contact holes) 21. In the edge termination region 60, the gate metal electrode 13 is connected to the conductive film 22 via the barrier metal 15 and the contact plugs 14 in contact holes (second contact holes) 21.

Next, at a surface (back surface of the semiconductor base) of the $n^+$-type semiconductor substrate 1, as the back electrode 11, a metal film containing, for example, nickel (Ni), titanium (Ti), gold (Au), silver (Ag), aluminum (Al), an alloy containing aluminum, etc. or a stacked film thereof (for example, Ti/Ni/Au, Al/Ti/Ni/Au, etc.) is formed. Subsequently, a heat treatment is performed and an ohmic junction between the $n^+$-type semiconductor substrate 1 and the back electrode 11 is formed. Thus, the trench-type MOSFET 70 is completed.

As described above, according to the embodiment, the heat treatment uses an oxygen ($O_2$) mixed gas only at the beginning and during the treatment period thereafter, the $O_2$ is cut, whereby the thin oxide film is formed in the contact holes. When the thin oxide film 34 is etched, even when the contact holes penetrate to the field oxide film therebelow, the loss of the field oxide film may be reduced. Therefore, the field oxide film may be sufficiently left, increase of the electric field at the bottom of the field oxide film does not occur, function as the field oxide film does not decrease, and the need to separately perform a contact formation process on the field oxide film, increase the thickness of the polysilicon, and introduce and manage equipment having high contact etching controllability is eliminated.

In the foregoing, while the present invention is described taking an instance in which a MOS gate structure is configured on the first main surface of a silicon substrate, without limitation hereto, various modifications are possible such as in the type (for example, silicon carbide (SiC), etc.) of semiconductor, surface orientation of the substrate surface, etc. Further, in the embodiments of the present invention, while a trench-type MOSFET is described as an example, without limitation hereto, application is further possible to semiconductor devices of various types of configurations such as MOS-type semiconductor devices like planar MOSFETS, IGBTs, etc. Further, in the embodiments, while the first conductivity type is assumed to be an n-type and the second semiconductor type is assumed to be a p-type, the present invention is similarly implemented when the first conductivity type is a p-type and the second semiconductor type is an n-type.

The semiconductor device and the method of manufacturing a semiconductor device according to the present invention achieve an effect in that the field oxide film may be prevented from becoming thin.

As described above, the semiconductor device and the method of manufacturing a semiconductor device according to the present invention are useful for high-voltage semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having
an active region through which a main current flows, and
a termination region surrounding a periphery of the active region in a plan view of the semiconductor device,
the semiconductor device comprising:
a semiconductor substrate of a first conductivity type, the semiconductor substrate having a main surface;
a drift layer of the first conductivity type, provided at the main surface of the semiconductor substrate;
a base layer of a second conductivity type, provided at a surface layer of the drift layer;
in the active region;
a source region of the first conductivity type, selectively provided in a surface layer of the base layer, a trench reaching the drift layer from a surface of the source region, and a gate electrode provided in the trench via a gate insulating film; and in the termination region;

a conductive film electrically connected to the gate electrode, a field oxide film that insulates the conductive film and the drift layer from each other, and a contact hole that penetrates through the conductive film and reaches the field oxide film, wherein the contact hole is embedded in the field oxide film such that a thickness of the field oxide film below the contact hole is 15.4%-24.3% thinner than a thickness of the field oxide film outside the contact hole.

2. The semiconductor device according to claim 1, further comprising a barrier metal covering sidewalls and a bottom of the contact hole; and a contact plug disposed in the contact hole on the barrier metal.

3. A method of manufacturing a semiconductor device having: a semiconductor substrate of a first conductivity type and having a main surface; a drift layer of the first conductivity type disposed on the main surface of the semiconductor substrate; an active region provided at a front surface of the drift layer and through which a main current flows; and a termination region surrounding a periphery of the active region, the method comprising:

forming a base layer of a second conductivity type at a surface layer of the drift layer;

forming a field oxide film at a surface of the drift layer in the termination region;

forming a trench reaching the drift layer from a surface of the base layer;

forming a gate insulating film in an entire area of an upper surface of the base layer;

depositing a polysilicon in an entire area of an upper surface of the gate insulating film;

etching the polysilicon, thereby, forming a gate electrode in the trench and a conductive film of the termination region;

selectively forming a source region of the first conductivity type in a surface layer of the base layer;

forming an interlayer insulating film in an entire area of an upper surface of the drift layer;

partially removing the interlayer insulating film, thereby, forming a first contact hole reaching the base layer in the active region and a second contact hole reaching the conductive film in the termination region;

performing a heat treatment, thereby, forming an oxide film in the first contact hole in the active region and in the second contact hole in the termination region;

performing etching, thereby, removing the oxide film; and forming a source electrode at the first contact hole in the active region and forming a gate metal electrode at the second contact hole in the termination region, wherein the heat treatment is performed using a first gas containing oxygen only at a beginning of the heat treatment and during a period thereafter, the oxygen is cut.

4. The method according to claim 3, wherein the base layer is formed after the gate electrode and the conductive film are formed but before the source region is formed.

5. The method according to claim 3, wherein the heat treatment is performed under the first gas containing oxygen only at the beginning of the heat treatment for 15 seconds to 60 seconds, and thereafter is performed under a second gas containing only nitrogen and free of oxygen for 30 minutes, the heat treatment being performed from the beginning until an end at a temperature in a range of 920 degrees C. to 1100 degrees C.

6. The method according to claim 3, wherein the first gas containing oxygen has an oxygen concentration of 100%.

7. The method according to claim 3, further comprising covering sidewalls and a bottom of the first contact hole in the active region and sidewalls and a bottom of the second contact hole in the termination region with a barrier metal, and forming a contact plug in each of the first and second contact holes on the barrier metal after removing the oxide film but before forming the source electrode and the gate metal electrode.

8. The method according to claim 3, wherein the oxide film has a thickness in a range of 2.5 nm to 10 nm.

9. The method according to claim 3, wherein the field oxide film is etched at least 3.75 nm but less than 15 nm in the second contact hole in the termination region when the oxide film is removed.

* * * * *